US011971455B2

(12) United States Patent
Duan et al.

(10) Patent No.: US 11,971,455 B2
(45) Date of Patent: Apr. 30, 2024

(54) STATE OF CHARGE AND STATE OF HEALTH ASSESSMENT OF A MIXED CHEMISTRY BATTERY

(71) Applicant: GM GLOBAL TECHNOLOGY OPERATIONS LLC, Detroit, MI (US)

(72) Inventors: Chengwu Duan, Shanghai (CN); Jian Yao, Shanghai (CN); Dewen Kong, Shanghai (CN); Jingyuan Liu, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 48 days.

(21) Appl. No.: 17/858,202

(22) Filed: Jul. 6, 2022

(65) Prior Publication Data

US 2023/0375628 A1 Nov. 23, 2023

(30) Foreign Application Priority Data

May 20, 2022 (CN) .......................... 202210548846.3

(51) Int. Cl.
*G01R 31/3842* (2019.01)
*G01R 31/392* (2019.01)
*H01M 10/48* (2006.01)
*H02J 7/00* (2006.01)
*H01M 4/02* (2006.01)
*H01M 4/505* (2010.01)
*H01M 4/525* (2010.01)
H01M 4/58 (2010.01)
*H01M 10/0525* (2010.01)

(52) U.S. Cl.
CPC ....... *G01R 31/3842* (2019.01); *G01R 31/392* (2019.01); *H01M 10/48* (2013.01); *H02J 7/0048* (2020.01); *H02J 7/005* (2020.01); *H01M 2004/028* (2013.01); *H01M 4/505* (2013.01); *H01M 4/525* (2013.01); *H01M 4/5825* (2013.01); *H01M 10/0525* (2013.01)

(58) Field of Classification Search
None
See application file for complete search history.

(56) References Cited

U.S. PATENT DOCUMENTS

2010/0225325 A1\* 9/2010 Christensen ....... G01R 31/3842
324/426

FOREIGN PATENT DOCUMENTS

DE 102012206893 A1 10/2013
DE 102020121612 A1 2/2022

OTHER PUBLICATIONS

International Search Report; International Application No. 10 2022 115 009.7; dated Mar. 22, 2023; 11 pages.

\* cited by examiner

*Primary Examiner* — Jas A Sanghera
(74) *Attorney, Agent, or Firm* — CANTOR COLBURN LLP

(57) ABSTRACT

A mixed chemistry battery is provided. The mixed chemistry battery includes a reference module having a first chemistry and a battery module having a second chemistry that is different that the first chemistry, the battery module is connected to the reference module in series. The mixed chemistry battery also includes a battery monitoring system configured to monitor an open circuit voltage of the reference module, an open circuit voltage of the battery module, and a current flow through the reference module and the battery module. The battery monitoring system is further configured to calculate a state-of-charge (SOC) and state-of-health (SOH) of the battery module based at least in part on a SOC of the reference module.

20 Claims, 4 Drawing Sheets

STATE OF CHARGE AND STATE OF HEALTH ASSESSMENT OF A MIXED CHEMISTRY BATTERY

PRIORITY CLAIM

This application claims priority to Chinese Patent Application No. 202210548846.3, filed May 24, 2022, and all the benefits accruing therefrom under 35 U.S.C. § 119, the contents of which in its entirety are herein incorporated by reference.

INTRODUCTION

The disclosure relates to mixed chemistry batteries. More specifically, the disclosure relates to determining the state of charge and state of health of a mixed chemistry battery.

Lithium-ion batteries are used in a variety of applications, from electric vehicles to residential batteries to grid-scale applications. In general, the term lithium-ion battery refers to a wide array of battery chemistries that each charge and discharge using reactions from a lithiated metal oxide cathode and a graphite anode. As used herein, a mixed chemistry battery is a lithium-ion battery that includes battery cells that have at least two different chemistries. Two of the more commonly used lithium-ion chemistries are nickel manganese cobalt (NCM) and lithium iron phosphate (LFP). In general, LFP batteries are less expensive to manufacture than NCM batteries and NCM batteries have higher power rating and energy density compared to LFP batteries.

NCM battery's state of charge (SOC) varies distinctly by its open-circuit voltage (OCV) level. On the other hand, the LFP battery's SOC level cannot be easily determined based on its OCV due to its flat charge-discharge curve. As a result, accurate SOC diagnosis is possible for NCM batteries while the SOC accuracy for LFP batteries is very challenging.

SUMMARY

In one exemplary embodiment, a mixed chemistry battery is provided. The mixed chemistry battery includes a reference module having a first chemistry and a battery module having a second chemistry that is different than the first chemistry, the battery module is connected to the reference module in series. The mixed chemistry battery also includes a battery monitoring system configured to monitor an open circuit voltage of the reference module, an open circuit voltage of the battery module, and a current flow through the reference module and the battery module. The battery monitoring system is further configured to calculate a state-of-charge (SOC) of the battery module based at least in part on a SOC of the reference module.

In addition to the one or more features described herein the SOC of the reference module is determined based on at least one of the open circuit voltage of the reference module and the current flow through the reference module is provided.

In addition to the one or more features described herein the battery monitoring system is further configured to calculate an estimated SOC of the battery module based on both the open circuit voltage of the battery module and the current flow through the battery module.

In addition to the one or more features described herein the battery monitoring system sets the SOC of the battery module to be equal to the SOC of the reference module based on a determination that the estimated SOC of the battery module is within a tolerance level of the SOC of the reference module.

In addition to the one or more features described herein the first chemistry is nickel-manganese cobalt and the second chemistry is lithium iron phosphate.

In addition to the one or more features described herein the reference module includes a first plurality of battery cells arranged in a first matrix and the battery module includes a second plurality of battery cells arranged in a second matrix.

In addition to the one or more features described herein the number and size of the first plurality of battery cells and the second plurality of battery cells are determined such that a capacity of the reference module is within a first threshold of a capacity of the battery module and such that the open circuit voltage of the reference module is within a second threshold of the open circuit voltage of the battery module.

In addition to the one or more features described herein the battery monitoring system is further configured to calculate a state-of-health of the battery module based at least in part on the SOC of the reference module.

In another exemplary embodiment, a method for determining a state-of-charge (SOC) of a battery module is provided. The method includes calculating a SOC of a reference module connected to the battery module in series and calculating an estimated SOC of the battery module based on an open circuit voltage of the battery module and a current flow through the battery module. The method further includes setting the SOC of the battery module to be equal to the SOC of the reference module based on a determination that the estimated SOC of the battery module is within a tolerance level of the SOC of the reference module.

In addition to the one or more features described herein the SOC of the reference module is calculated based on one of the open circuit voltage of the reference module and the current flow through the reference module.

In addition to the one or more features described herein the reference module includes a plurality of nickel-manganese cobalt (NCM) cells and the battery module includes a plurality of lithium iron phosphate (LFP) cells.

In addition to the one or more features described herein the number and size of the first plurality of NCM cells and the plurality of LFP cells are determined such that a capacity of the reference module is within a first threshold of a capacity of the battery module and such that the open circuit voltage of the reference module is within a second threshold of the open circuit voltage of the battery module.

In addition to the one or more features described herein the method also includes calculating a state-of-health (SOH) of the battery module based at least in part on the SOC of the reference module.

In addition to the one or more features described herein the SOH of the battery module is calculated by subtracting a difference of the SOC of the reference module in a fully charged state from a current SOC of the reference module from one hundred percent.

In another exemplary embodiment, a computer program product for determining a state-of-charge (SOC) of a battery module is provided. The computer program product includes a computer readable storage medium having program instructions embodied therewith, the program instructions executable by a processor to cause the processor to perform operations. The operations include calculating a SOC of a reference module connected to a battery module in series and calculating an estimated SOC of the battery module based on an open circuit voltage of the battery module and a current flow through the battery module. The operations further include setting the SOC of the battery module to be equal to the SOC of the reference module based on a determination that the estimated SOC of the battery module is within a tolerance level of the SOC of the reference module.

In addition to the one or more features described herein the SOC of the reference module is calculated based on one of the open circuit voltage of the reference module and the current flow through the reference module.

In addition to the one or more features described herein the reference module includes a plurality of nickel-manganese cobalt (NCM) cells and the battery module includes a plurality of lithium iron phosphate (LFP) cells.

In addition to the one or more features described herein the number and size of the first plurality of NCM cells and the plurality of LFP cells are determined such that a capacity of the reference module is within a first threshold of a capacity of the battery module and such that the open circuit voltage of the reference module is within a second threshold of the open circuit voltage of the battery module.

In addition to the one or more features described herein the operations also include calculating a state-of-health (SOH) of the battery module based at least in part on the SOC of the reference module.

In addition to the one or more features described herein the SOH of the battery module is calculated by subtracting a difference of the SOC of the reference module in a fully charged state from a current SOC of the reference module from one hundred percent.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
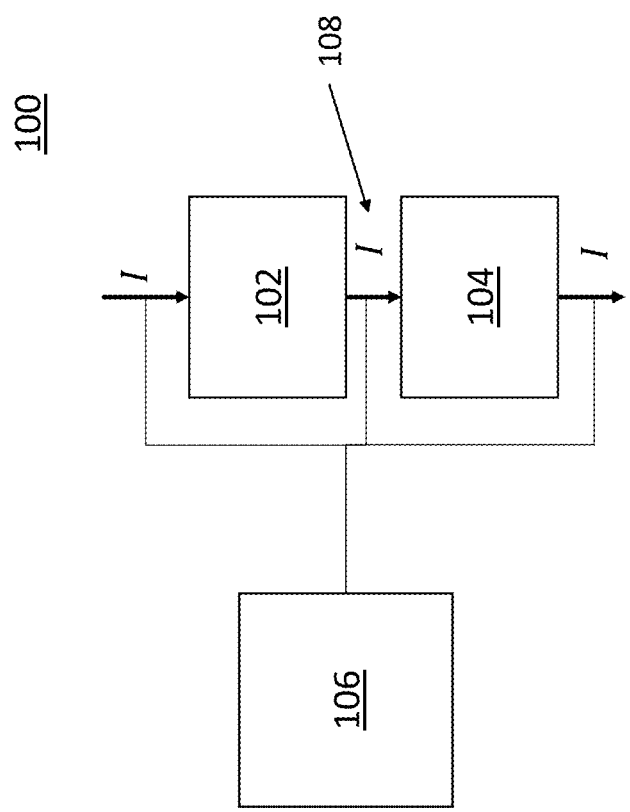
FIG. 1 is a block diagram illustrating a portion of a mixed chemistry battery in accordance with an exemplary embodiment.

The following description is merely exemplary in nature and is not intended to limit the present disclosure, its application or uses. Various embodiments of the disclosure are described herein with reference to the related drawings. Alternative embodiments of the disclosure can be devised without departing from the scope of this claims. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

Turning now to an overview of the aspects of the disclosure, embodiments of the disclosure include a mixed chemistry battery having a reference module and a battery module connected in series. The reference module is a lithium-ion battery module that includes a first chemistry that has a state-of-charge (SOC) that varies distinctly by its open circuit voltage (OCV) level, such as nickel manganese cobalt (NCM), nickel cobalt aluminum (NCA), lithium-ion manganese (LMO), lithium cobalt (LCO), or the like. The battery module is a lithium-ion battery module that includes a second chemistry that has a SOC that does not vary distinctly by its OCV level, such as LFP, lithium iron manganese phosphate (LFMP), sodium ion, or the like. As discussed above, while an NCM battery's SOC varies distinctly by its OCV, an lithium iron phosphate (LFP) battery's SOC level cannot be easily distinguished by its OCV due to its flat charge-discharge curve. Accordingly, in exemplary embodiments, the SOC of the reference module is used to determine the SOC and state of health (SOH) of the battery module.

In exemplary embodiments, the design of the battery module and the reference module are configured such that the OCV of the battery module and the reference module are within a specified threshold of one another. In addition, the capacity of the battery module and the reference module are configured to be within another specified threshold of one another. In one embodiment, the OCV of a new fully charged battery module is configured to be within 0.1 volts (V) of a new fully charged reference module. Likewise, in one embodiment, the capacity of a new fully charged battery module is configured to be within 0.1 kilowatt-hours (kWh) of a new fully charged reference module.

Referring now to FIG. 1 a portion of a mixed chemistry battery 100 in accordance with an exemplary embodiment is shown. As illustrated, the mixed chemistry battery 100 includes a reference module 102 that is connected in series with a battery module 104. The mixed chemistry battery 100 also includes a battery monitoring system 106 that is configured to monitor an open circuit-voltage (OCV) of both the reference module 102 and the battery module 104 as well as the current I 108 that flows through the reference module 102 and the battery module 104.

In exemplary embodiments, the battery monitoring system 106 includes one or more of a general processor, a central processing unit, an application-specific integrated circuit (ASIC), a digital signal processor, a field-programmable gate array (FPGA), a digital circuit, an analog circuit, or combinations thereof. In one embodiment, the battery monitoring system 106 also includes a memory in communication with the processor and other components of the battery monitoring system 106. In exemplary embodiments, the battery monitoring system 106 is configured to calculate and track the SOC and SOH of both the reference module 102 and the battery module 104.

Figure 2:
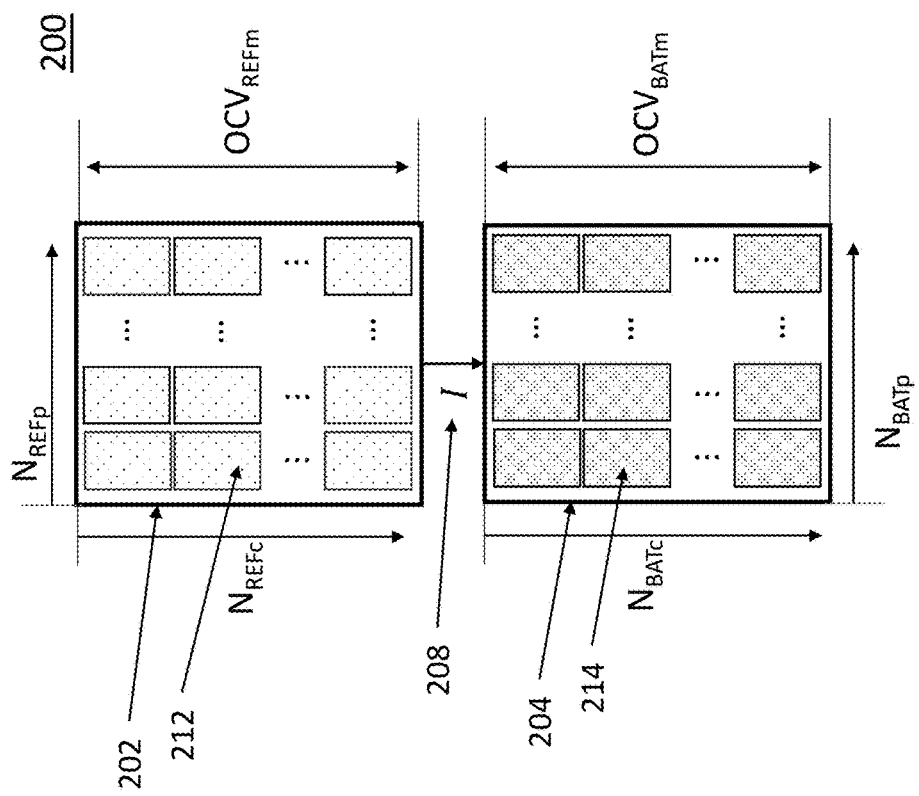
FIG. 2 is a block diagram illustrating a reference module and a battery module of a mixed chemistry battery in accordance with an exemplary embodiment.

Referring now to FIG. 2 a reference module 202 and a battery module 204 of a mixed chemistry battery 200 in accordance with an exemplary embodiment are shown. As illustrated, the reference module 202 is made up of a plurality of reference cells 212 that are arranged in a matrix configuration with $N_{REFc}$ reference cells 212 connected in series and with $N_{REFp}$ branches of reference cells 212 connected in parallel. Likewise, the battery module 204 is made up of a plurality of battery cells 214 that are arranged in a matrix configuration with $N_{BATc}$ reference cells 214 connected in series and with $N_{BATp}$ branches of reference cells 214 connected in parallel.

In exemplary embodiments, the OCV of the reference module 202 ($OCV_{REFm}$) is determined based on $N_{REFc}$ and the OCV of the battery module 204 is determined based on $N_{BATc}$. In one embodiment, the $OCV_{REFm}=OCV_{REFc} \times N_{REFc}$, where $OCV_{REFc}$ is the OCV of each reference cell 212 and $OCV_{BATm}=OCV_{BATc} \times N_{BATc}$ where $OCV_{BATc}$ is the OCV of each battery cell 214. In exemplary embodiments, the reference module 202 and the battery module 204 are configured such that $OCV_{refm} \approx OCV_{BATm}$, (i.e., such that the OCV of the reference module 202 and the battery module 204 are within a desired threshold of one another). In one embodiment, the desired threshold is 0.1 V. In one embodiment, the desired threshold is 1 V.

In exemplary embodiments, the capacity of the reference module ($C_{REFm}$) 202 is determined based on $N_{REFp}$ and the capacity of the battery module ($C_{BATm}$) 204 is determined based on $N_{BATp}$. In exemplary embodiments, the reference module 202 and the battery module 204 are configured such that $C_{refm} \approx C_{BATm}$, i.e., such that the capacity of the reference module 202 and the battery module 204 are within a desired threshold of one another. In one embodiment, the desired threshold is 0.1 kWh. In one embodiment, the desired threshold is 1 kWh.

Figure 3:
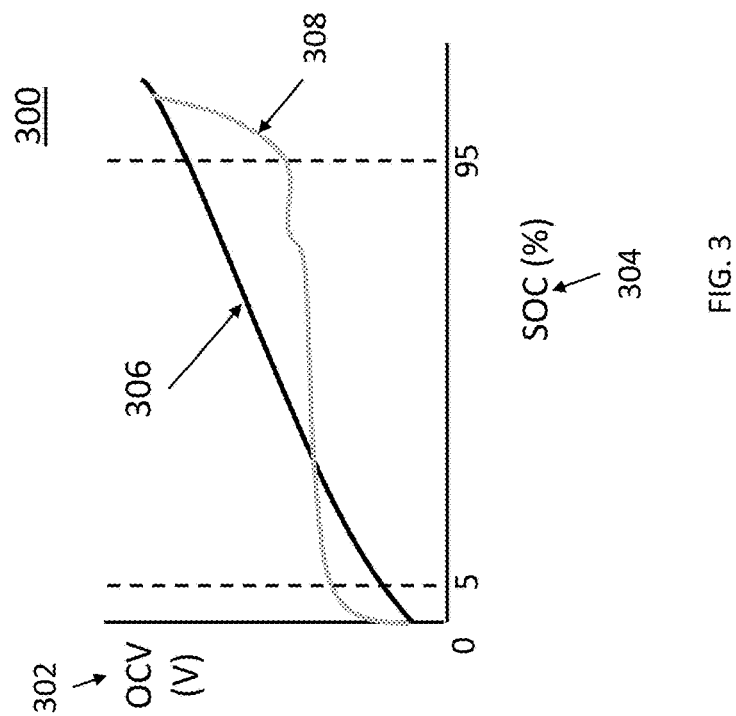
FIG. 3 is a graph illustrating a state of charge as a function of an open-circuit voltage of a reference module and a battery module in accordance with an exemplary embodiment.

Referring now to FIG. 3, a graph 300 illustrating the state of charge (SOC) 304 as a function of an open-circuit voltage (OCV) 302 of a reference module and a battery module in accordance with an exemplary embodiment is shown. As illustrated, the SOC curve 306 of the reference module is a generally straight line that has an approximately constant slope. In contrast, the SOC curve 308 of the battery module is generally flat between five percent and ninety-five percent SOC. As a result, the determination of the SOC of the battery module based on a measurement of the OCV of the battery module is error-prone and has a margin of error of approximately +/− ten percent.

Figure 4:
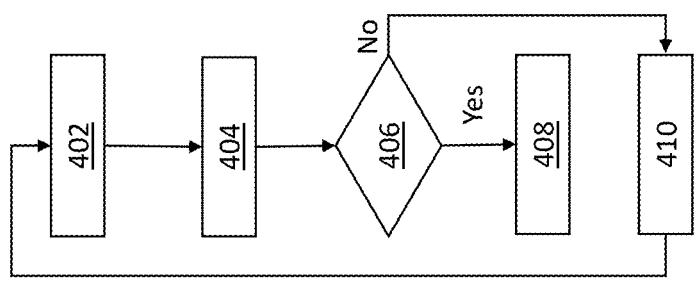
FIG. 4 is a flowchart illustrating a method for determining a state of charge of a battery module in a mixed chemistry battery in accordance with an exemplary embodiment.

Referring now to FIG. 4, a flowchart illustrating a method 400 for determining a state of charge of a battery module in a mixed chemistry battery in accordance with an exemplary embodiment is shown. In exemplary embodiments, the method 400 is performed by a battery management system, such as the one shown in FIG. 1. As shown at block 402, the method 400 includes calculating a SOC of the reference module ($SOC_{ref}$) based on the current flow, for example one of book-keeping methods, or based on the open-circuit voltage of the reference module. Next, as shown at block 404, the method 400 includes calculating an estimated SOC of the battery module ($SOC_{BATe}$) based on the current flow, for example book-keeping, and based on the open-circuit voltage of the battery module. In exemplary embodiments, the estimated SOC of the battery module is the average of the SOC determined based on the current flow, for example book-keeping, and the SOC based on the open-circuit voltage of the battery module. Book-keeping, such as coulomb counting, is a technique for tracking a SOC of a battery module that works by integrating the current flow through the battery module over time to derive the sum of energy entering/leaving the battery module.

Next, as shown at decision block 406, the method 400 includes determining if the absolute value of the difference between the $SOC_{BATe}$ and $SOC_{ref}$ is less than or equal to a tolerance value. In exemplary embodiments, the tolerance value is an acceptable amount of error between the $SOC_{BATe}$ and $SOC_{ref}$. In one embodiment, the tolerance value is three percent. In another embodiment, the tolerance value is one percent.

Continuing with reference to FIG. 4, based on a determination that the absolute value of the difference between the $SOC_{BATe}$ and $SOC_{ref}$ is less than or equal to the tolerance value, the method 400 proceeds to block 408 and sets the $SOC_{BATe}$ to be equal to the $SOC_{ref}$. Based on a determination that the absolute value of the difference between the $SOC_{BATe}$ and $SOC_{ref}$ is greater than the tolerance value, the method 400 proceeds to block 410 and waits for $SOC_{ref}$ to be less than a minimum threshold, such as five percent, or higher than a maximum threshold, such as ninety-five percent, (i.e., for the reference module to be almost depleted or fully charged). Once it is determined that the reference module is less than a minimum threshold or higher than a maximum threshold, the method 400 returns to block 402.

In addition to having a SOC that is difficult to accurately measure via OCV, battery modules having lithium-ion chemistries that have a relatively flat OCV curve, such as LFP, cannot use conventional dV/dt methods to accurately determine a state of health (SOH). Accordingly, in exemplary embodiments, a reference module, having a lithium-ion chemistry such as NCM, that is connected in series to a battery module is used to determine the SOH of the battery module.

Figure 5:
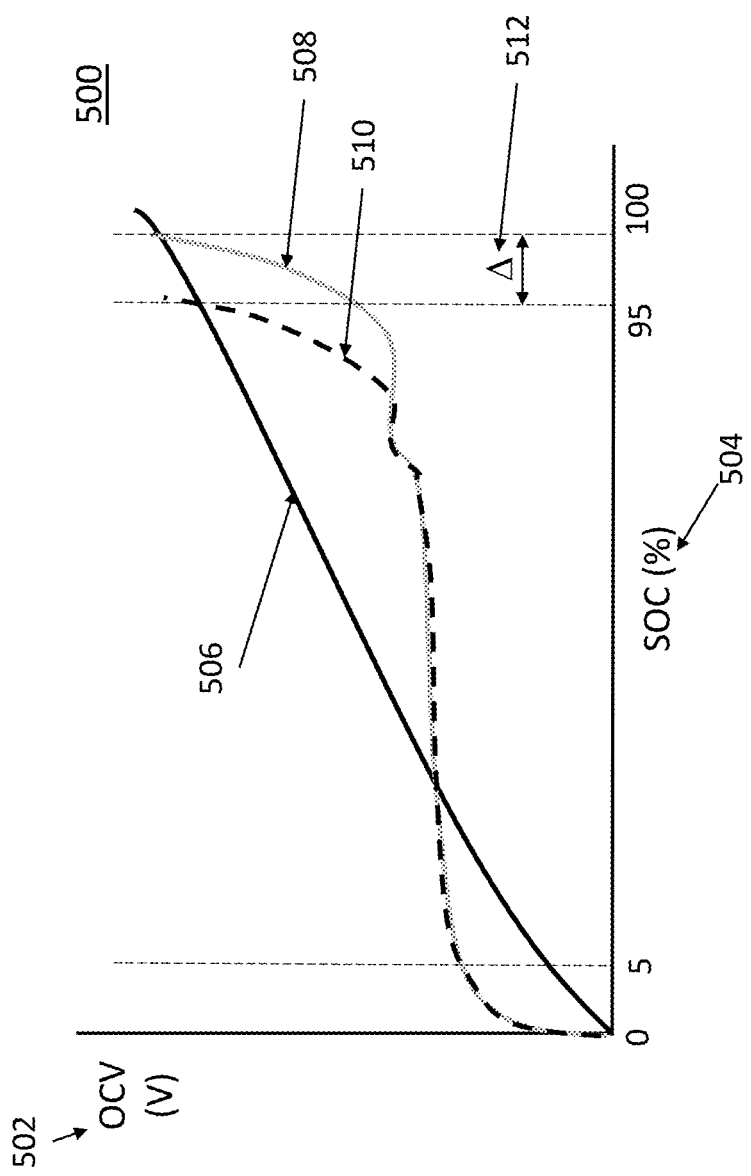
FIG. 5 is a graph illustrating a state of charge as a function of an open-circuit voltage of a reference module and a battery module in accordance with an exemplary embodiment.

Referring now to FIG. 5, a graph 500 illustrating a state of charge 504 as a function of an open circuit voltage 502 of a reference module and a battery module in accordance with an exemplary embodiment is shown. As shown, the SOC curve 506 of the reference module is a generally straight line that has an approximately constant slope. The graph 500 also illustrates a SOC curve 508 of a new battery module and a SOC curve 510 of a used battery module, (i.e., a battery module that has been through several depletion/charging cycles). In exemplary embodiments, a degradation factor (Δ) 512 of the battery module is calculated as the difference between the point at which the SOC curve 508 intersects the SOC curve 506 and the point at which the SOC curve 510 intersects the SOC curve 506. In the illustrated embodiment, the degradation factor 512 is five percent. In exemplary embodiments, the state of health (SOH) of the battery module is calculated as one hundred minus the degradation factor 512.

In exemplary embodiments, since the state of health of a battery module degrades over time, the SOH of the battery module is recalculated periodically. In one embodiment, the SOH of the battery module is recalculated after a set number of cycle counts of the battery module, (i.e., after the battery module has been drained and recharged a set number of times). In one embodiment, the SOH of the battery module is recalculated after every ten charging/depletion cycles.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, (i.e., one, two, three, four, etc.). The terms "a plurality" may be understood to include any integer number greater than or equal to two, (i.e., two, three, four, five, etc.). The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A mixed chemistry battery comprising:
    a reference module having a first chemistry;
    a battery module having a second chemistry that is different than the first chemistry, wherein the battery module is connected to the reference module in series; and
    a battery monitoring system configured to monitor an open circuit voltage of the reference module, an open circuit voltage of the battery module, and a current flow through the reference module and the battery module, wherein the battery monitoring system is further configured to calculate a state-of-charge (SOC) of the battery module based at least in part on a SOC of the reference module.

2. The mixed chemistry battery of claim 1, wherein the SOC of the reference module is determined based on at least one of the open circuit voltage of the reference module and the current flow through the reference module.

3. The mixed chemistry battery of claim 1, wherein battery monitoring system is further configured to calculate an estimated SOC of the battery module based on both the open circuit voltage of the battery module and the current flow through the battery module.

4. The mixed chemistry battery of claim 3, wherein battery monitoring system sets the SOC of the battery module to be equal to the SOC of the reference module based on a determination that the estimated SOC of the battery module is within a tolerance level of the SOC of the reference module.

5. The mixed chemistry battery of claim 1, wherein the first chemistry is nickel-manganese cobalt and the second chemistry is lithium iron phosphate.

6. The mixed chemistry battery of claim 1, wherein the reference module includes a first plurality of battery cells arranged in a first matrix and the battery module includes a second plurality of battery cells arranged in a second matrix.

7. The mixed chemistry battery of claim 6, wherein a number and a size of the first plurality of battery cells and the second plurality of battery cells are determined such that a capacity of the reference module is within a first threshold of a capacity of the battery module and such that the open circuit voltage of the reference module is within a second threshold of the open circuit voltage of the battery module.

8. The mixed chemistry battery of claim 1, wherein battery monitoring system is further configured to calculate a state-of-health of the battery module based at least in part on the SOC of the reference module.

9. A method for determining a state-of-charge (SOC) of a battery module, the method comprising:
    calculating a SOC of a reference module connected to the battery module in series;
    calculating an estimated SOC of the battery module based on an open circuit voltage of the battery module and a current flow through the battery module; and
    setting the SOC of the battery module to be equal to the SOC of the reference module based on a determination that the estimated SOC of the battery module is within a tolerance level of the SOC of the reference module.

10. The method of claim 9, wherein the SOC of the reference module is calculated based on one of the open circuit voltage of the reference module and the current flow through the reference module.

11. The method of claim 9, wherein the reference module includes a plurality of nickel-manganese cobalt (NCM) cells and the battery module includes a plurality of lithium iron phosphate (LFP) cells.

12. The method of claim 11, wherein a number and a size of the first plurality of NCM cells and the plurality of LFP cells are determined such that a capacity of the reference module is within a first threshold of a capacity of the battery module and such that the open circuit voltage of the reference module is within a second threshold of the open circuit voltage of the battery module.

13. The method of claim 9, further comprising calculating a state-of-health (SOH) of the battery module based at least in part on the SOC of the reference module.

14. The method of claim 13, wherein the SOH of the battery module is calculated by subtracting a difference of the SOC of the reference module in a fully charged state from a current SOC of the reference module from one hundred percent.

15. A computer program product comprising a non-transitory computer readable storage medium having program instructions embodied therewith, the program instructions executable by a processor to cause the processor to perform operations comprising:
    calculating a SOC of a reference module connected to a battery module in series;
    calculating an estimated SOC of the battery module based on an open circuit voltage of the battery module and a current flow through the battery module; and
    setting the SOC of the battery module to be equal to the SOC of the reference module based on a determination that the estimated SOC of the battery module is within a tolerance level of the SOC of the reference module.

16. The computer program product of claim 15, the SOC of the reference module is calculated based on one of the open circuit voltage of the reference module and the current flow through the reference module.

17. The computer program product of claim 15, wherein the reference module includes a plurality of nickel-manganese cobalt (NCM) cells and the battery module includes a plurality of lithium iron phosphate (LFP) cells.

18. The computer program product of claim 17, wherein a number and a size of the first plurality of NCM cells and the plurality of LFP cells are determined such that a capacity of the reference module is within a first threshold of a capacity of the battery module and such that the open circuit voltage of the reference module is within a second threshold of the open circuit voltage of the battery module.

19. The computer program product of claim 15, wherein the operations further comprising calculating a state-of-health (SOH) of the battery module based at least in part on the SOC of the reference module.

20. The computer program product of claim 19, wherein the SOH of the battery module is calculated by subtracting a difference of the SOC of the reference module in a fully charged state from a current SOC of the reference module from one hundred percent.

\* \* \* \* \*